US006350353B2

United States Patent
Gopalraja et al.

(10) Patent No.: US 6,350,353 B2
(45) Date of Patent: *Feb. 26, 2002

(54) ALTERNATE STEPS OF IMP AND SPUTTERING PROCESS TO IMPROVE SIDEWALL COVERAGE

(75) Inventors: Praburam Gopalraja, Sunnyvale; Sergio Edelstein, Los Gatos; Avi Tepman, Cupertino; Peijun Ding, San Jose; Debabrata Ghosh, San Jose; Nirmalya Maity, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/449,202

(22) Filed: Nov. 24, 1999

(51) Int. Cl.[7] .......................... C23C 14/34; C23C 14/35
(52) U.S. Cl. .............................. 204/192.3; 204/298.08; 204/298.06; 204/192.12; 204/192.32; 204/298.13
(58) Field of Search ...................... 204/298.08, 192.3, 204/298.06, 192.12, 192.32, 298.13

(56) References Cited

U.S. PATENT DOCUMENTS

| 3,410,774 A | 11/1968 | Barson et al. ............... 204/192 |
| 4,874,493 A | 10/1989 | Pan ........................ 204/192.11 |
| 4,874,494 A | * 10/1989 | Ohmi ..................... 204/192.12 |
| 4,963,239 A | 10/1990 | Shimamura et al. ... 204/192.12 |
| 4,999,096 A | * 3/1991 | Nihei et al. ............... 204/192.3 |
| 5,510,011 A | 4/1996 | Okamura et al. ......... 204/192.3 |
| 5,585,974 A | 12/1996 | Shrinkle ...................... 360/46 |
| 5,639,357 A | 6/1997 | Xu ........................... 204/192.3 |
| 5,651,865 A | 7/1997 | Sellers ................... 204/192.13 |
| 5,718,813 A | 2/1998 | Drummond et al. ... 204/192.12 |
| 5,725,739 A | * 3/1998 | Hu ........................... 204/192.3 |
| 5,770,023 A | 6/1998 | Sellers .................... 204/192.3 |
| 5,780,357 A | 7/1998 | Xu et al. ..................... 438/639 |
| 5,807,467 A | 9/1998 | Givens et al. ......... 204/192.12 |
| 5,810,982 A | 9/1998 | Sellers .................. 204/298.08 |
| 5,863,392 | 1/1999 | Drummond et al. ... 204/192.12 |
| 5,968,327 A | * 10/1999 | Kobayashi et al. ..... 204/298.08 |

OTHER PUBLICATIONS

U.S. application No. 08/989,759, Tanaka, filed Dec. 12, 1997, "Step Coverage And Overhang Improvement By Pedestal Bias Voltage Modulation".
U.S. application No. 08/768,058, Ramaswami, filed Dec. 16, 1996, "Selective Physical Vapor Deposition Conductor Fill in IC Structure".
U.S. application No. 08/718,656, Mosley, filed Sep. 23, 1996, "Semi–Selective Chemical Vapor Deposition".
U.S. application No. 09/219,187, Sivaramakrishnan, filed Dec. 21, 1998, "Improved Physical Vapor Deposition of Semiconducting and Insulating Materials".

* cited by examiner

*Primary Examiner*—Mark F. Huff
*Assistant Examiner*—Daborah Chacko-Davis
(74) *Attorney, Agent, or Firm*—Moser, Patterson & Sheridan, LLP

(57) ABSTRACT

The present invention provides a method and apparatus for achieving conformal step coverage on a substrate by PVD. A target provides a source of material to be sputtered by a plasma and then ionized. Ionization is facilitated by maintaining a sufficiently dense plasma using, for example, an inductive coil. The ionized material is then deposited on the substrate which is biased to a negative voltage. A signal provided to the target during processing includes a negative voltage portion and a zero-voltage portion. During the negative voltage portion, ions are attracted to the target to cause sputtering. During the zero-voltage portion, sputtering from the target is terminated while the bias on the substrate cause reverse sputtering therefrom. Accordingly, the negative voltage portion and the zero-voltage portion are alternated to cycle between a sputter step and a reverse sputter step. The film quality and uniformity can be controlled by adjusting the frequency of the signal, the chamber pressure, the power supplied to each of the support member and other process parameters.

21 Claims, 4 Drawing Sheets

ALTERNATE STEPS OF IMP AND SPUTTERING PROCESS TO IMPROVE SIDEWALL COVERAGE

BACKGROUND OF THE INVENTION

1. Field of the Invention

The present invention relates to an apparatus and method for processing substrates. Specifically, the invention relates to a method for depositing a conformal layer of material on a substrate using physical vapor deposition process.

2. Background of the Related Art

Sub-quarter micron multi-level metallization represents one of the key technologies for the next generation of ultra large-scale integration (ULSI) for integrated circuits (IC). In the fabrication of semiconductor and other electronic devices, directionality of particles being deposited on a substrate is important to improve adequate in filling of electric features. As circuit densities increase, the widths of vias, contacts and other features, as well as the dielectric materials between them, decrease to 0.25 µm or less, whereas the thickness of the dielectric layer remains substantially constant. Thus, the aspect ratios for the features, i.e., the ratio of the depth to the minimum lateral dimension, increases, thereby pushing the aspect ratios of the contacts and vias to 5:1 and above. As the dimensions of the features decrease, it becomes even more important to get directionality in order to achieve conformal coverage of the feature sidewalls and bottoms.

Conventionally, physical vapor deposition (PVD) systems have been used to deposit materials in device features formed on a substrate. PVD systems are well known in the field of semiconductor processing for forming metal films. Generally, a power supply connected to a processing chamber creates an electrical potential between a target and a substrate support member within the chamber and generates a plasma of a processing gas in the region between the target and substrate support member. Ions from the plasma bombard the negatively biased target and sputter material from the target which then deposits onto a substrate positioned on the substrate support member. However, while such processes have achieved good results for lower aspect ratios, conformal coverage becomes difficult to achieve with increasing aspect ratios. In particular, it has been shown that coverage of the bottoms of the vias decreases with increasing aspect ratios.

One process capable of providing greater directionality to particles is ionized metal plasma-physical vapor deposition (IMP-PVD), also known as high density physical vapor deposition (HDP-PVD). Initially, a plasma is generated by introducing a gas, such as helium or argon, into the chamber and then biasing a target to produce an electric field in the chamber, thereby ionizing a portion of the gas. An energized coil positioned proximate the processing region of the chamber couples electromagnetic energy into the plasma to result in an inductively-coupled medium/high density plasma between the target and a susceptor on which a substrate is placed for processing. The ions and electrons in the plasma are accelerated toward the target by the bias applied to the target causing the sputtering of material from the target. Under the influence of the plasma, the sputtered metal flux is ionized. An electric field due to an applied or self-bias, develops in the boundary layer, or sheath, between the plasma and the substrate that accelerates the metal ions towards the substrate in a direction substantially parallel to the electric field and perpendicular to the substrate surface. The bias energy is preferably controlled by the application of power, such as RF, to the susceptor to attract the sputtered target ions in a highly directionalized manner to the surface of the substrate to fill the features formed on the substrate.

One of the problems with HDP-PVD processes is the inability to achieve conformal step coverage in the increasingly smaller device features. Conformal coverage of the bottoms and sidewalls of the features is needed to optimize subsequent processes such as electroplating. Electroplating requires conformal barrier and seed layers within the device features in order to ensure uniform filling of the feature. While conventional HDP-PVD achieves good bottom coverage due to the directionality of the ions provided by the bias on the substrate, the sidewall coverage can be less than conformal. This result is caused in part by the induced high directionality of ions towards the bottom of the features with little directionality toward the sidewalls.

The effects of a bias on film deposition on and into the features in/on a substrate can be described with reference to FIGS. 1–2 which illustrate the direction of metal ions 12 entering a via 16 formed on a substrate 10. FIG. 1 illustrates a DC magnetron PVD processing environment wherein no bias is supplied to the substrate 10 (the presence or absence of an applied bias being substantially irrelevant to traditional planar target DC sputtering). As a result, the directionality of the ions 12 is determined primarily by the ejection profile of material (usually atoms) from the target and by the inelastic collisions with other particles in the chamber, such as Ar ions which are provided in a plasma. The angular distribution 22 of the ions in FIG. 1 typically results in little deposition on the bottom 18 of the via 16. In addition to the angular distribution of the incoming ions 12, the feature dimensions also determine the resulting step coverage. Thus, where the feature opening is wider than the depth of the feature, deposition material can reach all surfaces of the feature for relatively uniform deposition. However, where the feature is narrow compared to the depth, the particles travelling substantially non-parallel to the feature depth deposit around the feature opening, resulting in less deposition at the bottom 18 of the via 16.

FIG. 2 illustrates the processing environment in a HDP-PVD process wherein the angular distribution of the ions 12 is influenced by the electrical field E due to interaction between the charged target material and the applied or self-bias at the surface of the substrate. The electric field E is oriented perpendicular to the substrate 10 and the positively charged ions 12 are influenced into a trajectory parallel to the electric field E toward the bottom 18 of the via 16. The angular distribution 23 of the ions 12 in FIG. 2 typically results in moderate to lower deposition on the sidewalls 20 and higher to moderate deposition on the bottom 18 than is possible without ionization of the sputtered material. As compared to the angular distribution 22 of FIG. 1, the distribution 23 exhibits a tighter distribution indicating more directionality parallel to the electric field E.

Therefore, there is a need to provide a technique for depositing a layer conformal over the surface of features, particularly sub-half micron and higher aspect ratio features.

SUMMARY OF THE INVENTION

The present invention generally provides an apparatus and method for depositing a conformal layer on device features in a plasma chamber by PVD. In one aspect of the invention, a chamber having a target, a power supply coupled to the target adapted to provide a signal having a desired waveform, a substrate support member, a power supply connected to the substrate support member, and a magnetic field generator is provided. The target comprises a material to be sputtered by a plasma formed adjacent to the target during processing. The signal supplied by the power supply coupled to the target preferably comprises a negative voltage portion and a zero-voltage portion. Preferably, the power supply connected to the substrate support member supplies a substantially constant negative bias to the substrate.

In another aspect of the invention, a plasma is supplied to a chamber to sputter a material from a target. A coil is energized proximate the chamber to enhance ionization of the sputtered material. During processing, a modulated signal is provided to the target. In one embodiment, the modulated signal is varied between a negative voltage portion during which the target material is sputtered onto a substrate and a zero-voltage portion during which the deposited material is re-sputtered from the substrate. A bias is provided to the substrate to influence the direction of ions in the chamber during processing.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The embodiments described below preferably use a modified ionized metal plasma (IMP) process that can be carried out using process equipment, such as an Endura® platform, available from Applied Materials, Inc., located in Santa Clara, Calif. with modifications as described below. The equipment preferably includes an integrated platform having a preclean chamber, an IMP-PVD barrier layer chamber, a PVD chamber, an IMP-PVD seed layer chamber, and a CVD chamber. One ion metal plasma (IMP) processing chamber, known as an IMP VECTRA™/ELECTRA™ Chamber is available from Applied Materials, Inc., of Santa Clara, Calif.

Figure 1:
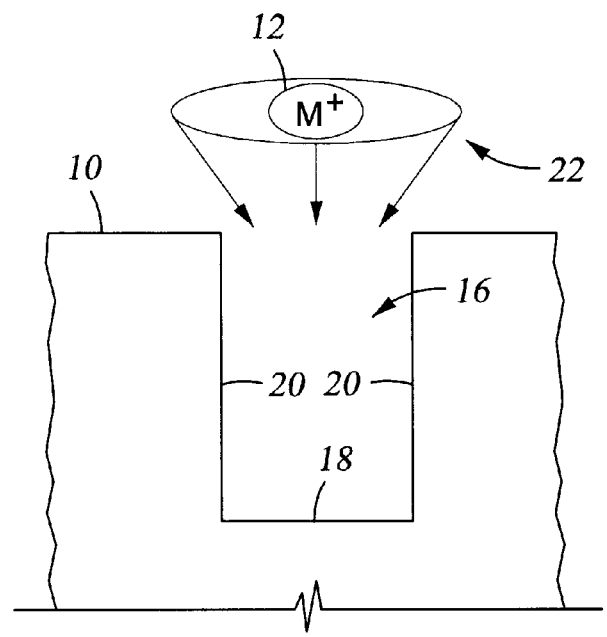
FIG. 1 is a cross-section of a substrate having a via formed therein and illustrates cosine distribution of sputtered material.
Figure 2:
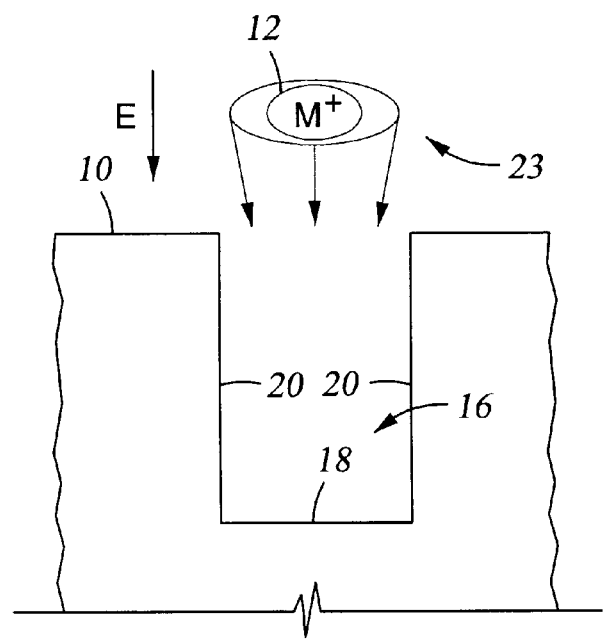
FIG. 2 is a cross-section of a substrate having a via formed therein and illustrates over-cosine distribution of sputtered material.
Figure 3:
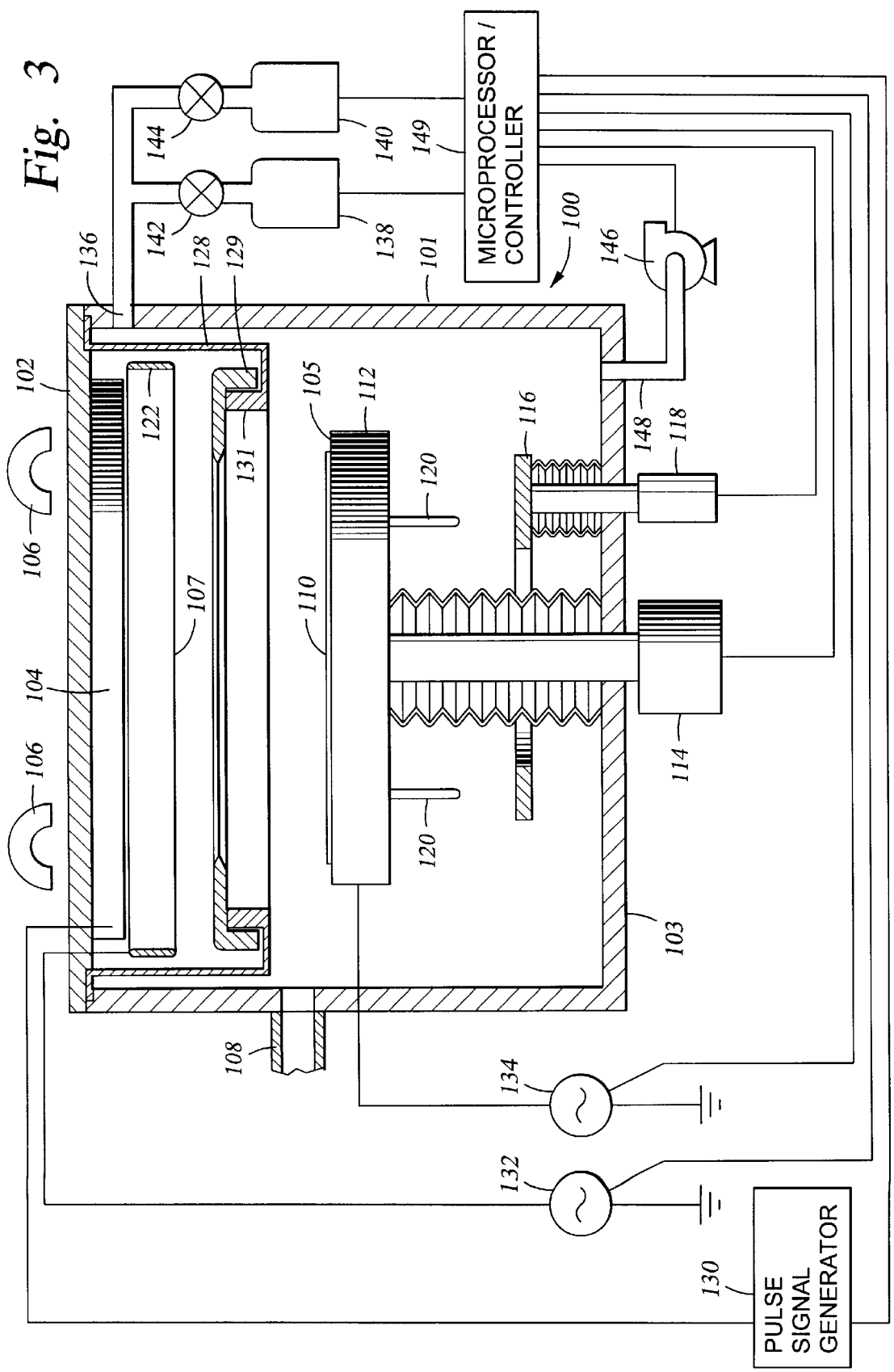
FIG. 3 is a cross-section of a simplified processing chamber of the invention having a coil disposed therein.

FIG. 3 is a schematic cross-sectional view of an IMP chamber 100 according to the present invention. The chamber 100 includes walls 101, lid 102, and bottom 103. A target 104 comprising the material to be sputtered is mounted to the lid 102 and disposed in the chamber 100 to define an upper boundary to a processing region 107. Magnets 106 are disposed behind the lid 102 and are part of a rotatable magnetron which traps electrons during operation and increases the density of a plasma adjacent to the target 104.

A substrate support member 112 supports the substrate 110 and defines the lower boundary to the processing region 107. The substrate support member 112 is movably disposed in the chamber 100 and provides an upper support surface 105 for supporting a substrate 110. The support member 112 is mounted on a stem 109 connected to a motor assembly 114 that raises and lowers the substrate support 112 between a lowered loading/unloading position and a raised processing position. An opening 108 in the chamber 100 provides access for a robot (not shown) to deliver and retrieve substrates 110 to and from the chamber 100 while the substrate support member 112 is in the lowered loading/unloading position.

A coil 122 is mounted in the chamber 100 between the substrate support member 112 and the target 105 and, when an AC current is passed therethrough, provides electromagnetic fields in the chamber 100 during processing to assist in generating and maintaining a plasma between the target 104 and substrate 110. The electromagnetic fields produced by the coil 122 induces currents in the plasma to densify the plasma, ire., to increase the ionization of the gas and the sputtered target material. The ionized material is attracted toward the substrate 110 by virtue of the electrical attraction between the positively charged ions and the negatively biased substrate support member 112 (which is biased either with a power supply or is self biased). By virtue of this "attraction" the sputtered material ions reaching the substrate are aligned more parallel to the depth access of the features. In addition, the coil 122 itself attains a negative self-bias causing the coil 122 to be sputtered.

The chamber 100 optionally includes a process kit comprising a process shield 128 and a shadow ring 129. The process shield 128 is an annular member suspended from the lid 102 between the coil 122 and the body 101. An upwardly turned wall 131 of the process shield 128 is adapted to support the shadow ring 129 while the support member 112 is in a lowered position. To provide a return path for RF currents in the chamber 100 the process shield is preferably coupled to ground.

One or more plasma gases are supplied to the chamber 100 through a gas inlet 136 from gas sources 138, 140 as metered by respective mass flow controllers 142, 144. One or more vacuum pumps 146 arc connected to the chamber 100 at an exhaust port 148 to exhaust the chamber 100 and maintain the desired pressure in the chamber 100. Preferably the vacuum pumps 146 include a cryopump and a roughing pump and are capable of sustaining a base pressure of about $10^{-8}$ mTorr.

Three power supplies are preferably used to bias elements of the chamber 100. A first power supply 130 delivers a modulated or oscillating power signal to the target 104. The first power supply 130 may be a direct current (DC) or radio frequency (RF) power supply capable of providing a signal to the target 104 having a desired waveform. However, the particular arrangement used to provide the signal to the target 104 is not limiting of the present invention and may include any conventional components known in the art, such as switches, pulse generators, microprocessors and the like. A second power source 132, preferably a RF power source, supplies electrical power in the megahertz range to the coil 122 to increase the density of the plasma. A third power source 134 supplies an RF power signal to bias the substrate support member 112 with respect to the plasma and provides an electric field adjacent a substrate to attract the ionized sputtered material toward the substrate 110.

In operation, a robot delivers a substrate 110 to the chamber 100 through the opening 108. After placing the substrate 110 upon the upper surface 105 of the support member 112 the robot retracts from the chamber 100 and the opening 108 is sealed. The substrate support member 112 then raises the substrate 110 into a processing position. During the upward movement of the support member 112 the shadow ring 129 is lifted from the process shield 128. During processing, the shadow ring 129 covers a perimeter portion (usually less than 3 millimeters) of the substrate 110. Preferably, the space between the target 104 and the substrate support member 112 in a raised processing position is between about 90 mm and 199 mm.

One or more plasma gases are then introduced into the chamber 100 from the gas sources 138, 140 to stabilize the chamber 100 at a processing pressure. The target receives a negative DC bias which, in conjunction with magnets 106, facilitates the formation of a plasma adjacent the target 104. The power supply 130 provides a periodic bias which attracts the charged particles of the plasma toward the target 104 to cause sputtering therefrom.

The coil 122 is energized by the third signal generator 132 and operates to increase the density of the plasma, thereby facilitating ionization of sputtered target material. A portion of the ions formed from the sputtered target material continue to traverse the space between the target 104 and the support member 112 and deposit on the substrate 110 which is biased by the third power supply 134. The biases to the target 104 and support member 112 are controlled according to the processes described in detail below.

Following the deposition cycle, the substrate support member 112 is lowered to a loading/unloading position. The robot is then extended into the chamber 100 through the opening 108 and the substrate 110 is placed on the robot for removal from the chamber 100 and delivery to a subsequent location. Subsequent locations include various processing chambers, such as electroplating chambers, where the substrate 110 undergoes additional processing.

The present invention utilizes alternating steps of sputtering and reverse sputtering to achieve conformal coverage of the feature formed on the substrate. Good step coverage on the device features of the substrate 110 is achieved by ensuring proper proportions of bottom coverage and sidewall coverage of the features. According to one aspect of the present invention, the proportions of coverage are controlled by adjusting the sputtering and reverse sputtering steps and other process parameters. Throughout the following discussion, periodic reference is made to FIG. 3 where necessary.

Figure 4:
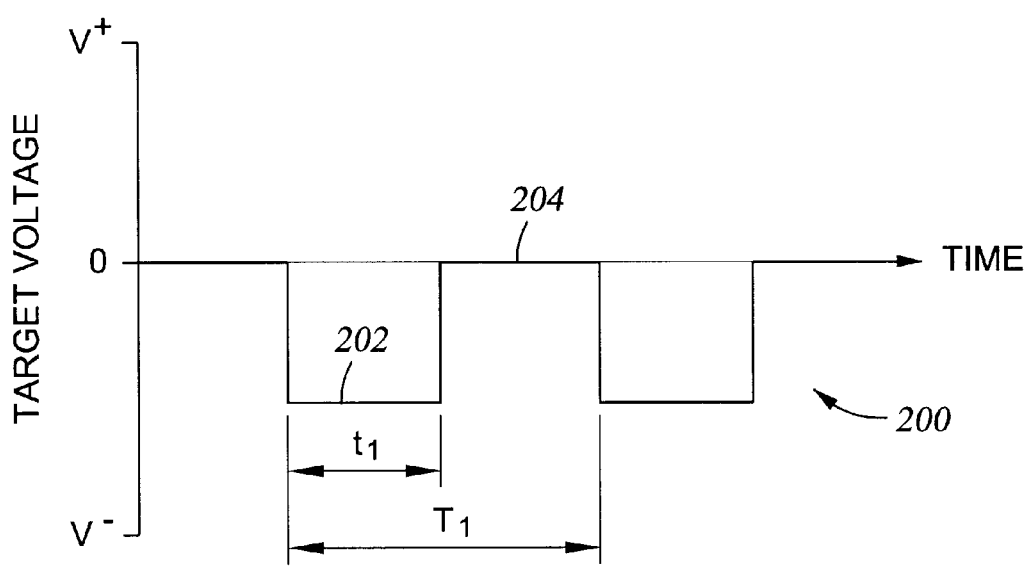
FIG. 4 is a graphical illustration of a signal applied to a target.

During the deposition process, the power supply 130 delivers a signal 200 to the target 104 having a desired waveform. The signal 200, shown in FIG. 4, is a square wave or step function and includes a negative voltage portion 202 and a zero-voltage portion 204. Although shown here as a square wave, any waveform oscillated between a negative voltage portion and a less negative or zero voltage portion may be used to advantage. During the negative voltage portion 202, the positively charged ions supplied by the plasma gas, such as Ar, bombard the target 104 causing ejection of material therefrom. The energy with which the Ar ions strike the target 104, can be controlled by adjusting the bias to the target 104, i.e., a greater bias resulting in greater ion energy. Preferably, the negative voltage portion 202 is between about −50 V and −600 V. The metal flux produced during the negative voltage portion 202 of the signal 200 is then ionized by the plasma maintained by the coil bias and the target bias and subsequently forms a layer on the substrate 110.

During the subsequent zero-voltage portion 204 of the signal 200, the direction of the positively charged Ar ions is determined primarily by the negative bias on the substrate 110 supplied by the third power supply 134. Preferably, the bias to the substrate 110 remains constant throughout the deposition cycle so that a constant voltage drop is established across a region between the plasma and the substrate 110 known as the sheath or dark space. Due to the resulting voltage drop in the sheath, an electric field is generated substantially perpendicular to the substrate 110, thereby causing the ions to accelerate toward the substrate. As in the sputtering step described above, the ions strike the substrate with sufficient energy to cause reverse sputtering, or re-sputtering, of the material previously deposited onto the substrate from the target 104. Thus, during the zero-voltage portion 202 of the signal 200, sputtering from the target 104 is substantially terminated and the previously deposited material on the substrate 110 is re-sputtered therefrom. The result of the reverse sputtering step is to redistribute and planarize the deposited material on the substrate, thereby achieving greater uniformity and superior step coverage. It should be noted that impinging ions will sputter the substrate 110 during the negative voltage portion 202 as well as the zero-voltage portion 204 due to the constant bias applied to the substrate 110. However, the flux of sputtered material will be substantially less during zero-voltage portion 204 since only the coil 122 will be sputtered. As a result, negative voltage portion 202 provides for net deposition on the substrate 110, while zero-voltage portion 204 provides for net re-sputtering of material with only a little deposition onto the substrate 110. The effects of the oscillating signal 200 on deposition will be described below with reference to FIGS. 8–9.

Preferably, the negative voltage portion 202 and the zero-voltage portion 204 are sequentially alternated to result in a series of sputtering steps (or high deposition rate steps) and reverse sputtering steps (or low deposition rate steps). The frequency and duty cycle of the signal 200 can be adjusted to increase the sputtering step or the reverse sputtering step to achieve the desired results. Preferably, the frequency of the signal 200 is between about 0.01 Hz and 1 Hz. As defined herein, the duty cycle is the ratio of the width, t1, of the negative voltage portion 202 to the signal period T1, shown in FIG. 4. Preferably, the duty cycle is between about 10% and about 80%, wherein the negative voltage portion width t1 is between about 0.55 seconds and about 60 seconds.

Figure 5:
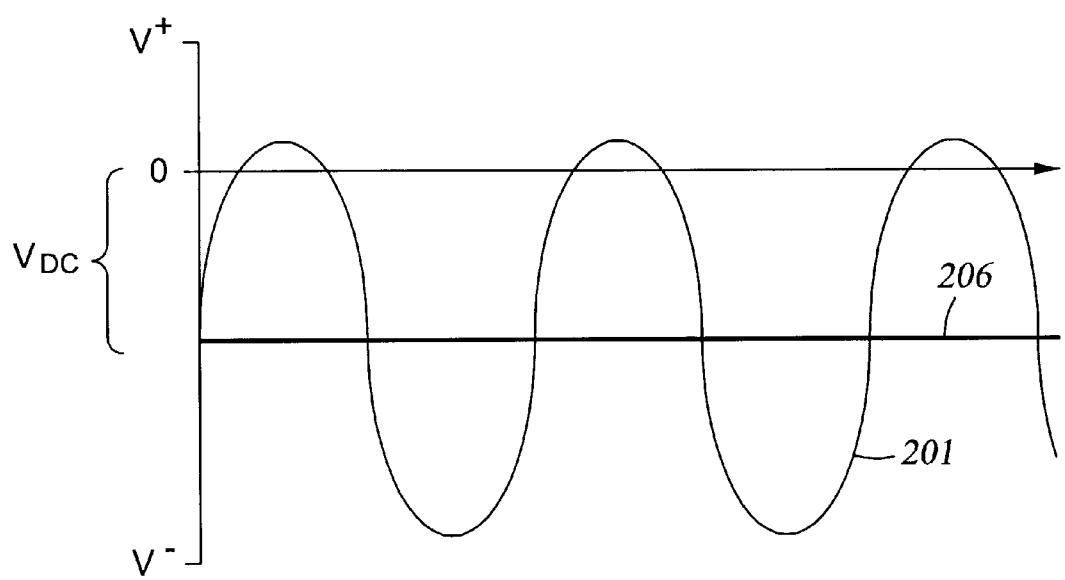
FIG. 5 is a graphical illustration of a signal applied to a substrate.

Although the voltage applied to the substrate 110 may be modulated in a manner similar to the signal 200 provided to the target 104, preferably the voltage is maintained at a substantially constant value throughout a deposition cycle. FIG. 5 shows an RF signal 201 provided to the substrate 110 by the third power supply 134. In the presence of a plasma, the signal 201 is shifted downward into the negative voltage region resulting in an induced DC bias (Vdc) on the substrate 110. The Vdc, shown in FIG. 5 as a signal 206, is maintained at a substantially constant value. In one embodiment, the power from the third power supply 134 is sufficient to produce an applied bias on the substrate 110 between about 0 V and −300 V. The particular values for power and voltage may be adjusted to achieve the desired result.

Figure 6:
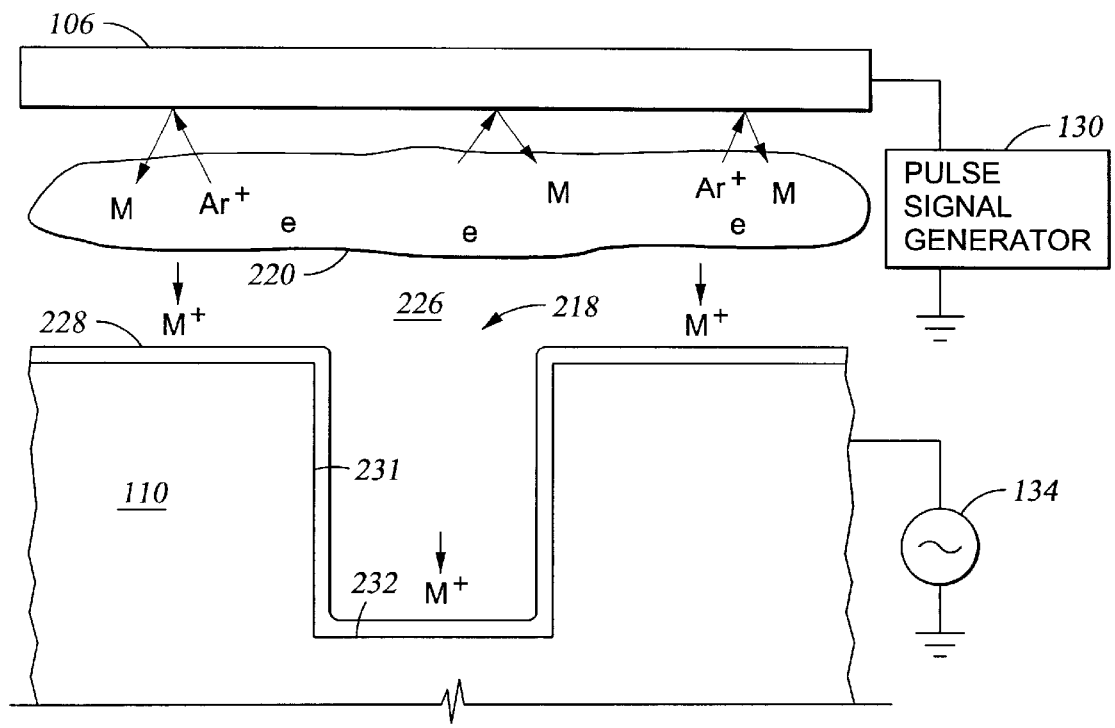
FIG. 6 is a cross section of a substrate and a target illustrating sputtering.

As described above, the invention provides a method of controlling the deposition of a material deposited on a substrate and may be illustrated with reference to FIGS. 8–9. FIG. 6 is a schematic side view of a substrate 110 and a target 104 during application of the negative voltage portion 202 of the signal 200 thereto. The substrate 110 has a feature 218 such as a via, formed therein. A plasma 220 is maintained between the substrate 110 and the target 104. Preferably, the plasma is generated using argon due to argon's low sticking coefficient which reduces the potential for poisoning the target 104 or the resulting film formed on the substrate 110 with substantial argon. However, other non-reactive gases such as He, $N_2$, Xe, Kr and Ne may be used to advantage. Subsequent to the formation of the plasma 220, Ar ions are attracted to the target 104 under the influence of the negative bias provided by the power supply 130. The Ar ions then strike the target 104 with sufficient energy to dislodge, or sputter, material from the target 1 04. The target 104 may comprise one or more of Cu, Al, W, Ti, and Ta, among other materials. The metal flux ejected from the target 104 traverses the processing region 107, where at least a portion of it is ionized by the plasma 220. The directionality of the ionized target material is then affected by the voltage drop across the sheath 226. The voltage drop can be modified by application of a bias to the substrate 110 using the third power supply 134. The result of the deposition step during the negative voltage portion 202 of the signal 200 is to form a layer 228 on the substrate 110. Due to the bias applied to the substrate 110, the angular distribution of the ionized target material results in proportionately more deposition at the bottom 232 of the feature 218.

The negative bias on the substrate 110 also attracts the Ar ions to cause some re-sputtering of deposited material. However, the rate of deposition is higher than the rate of re-sputtering, thereby achieving net deposition.

Figure 7:
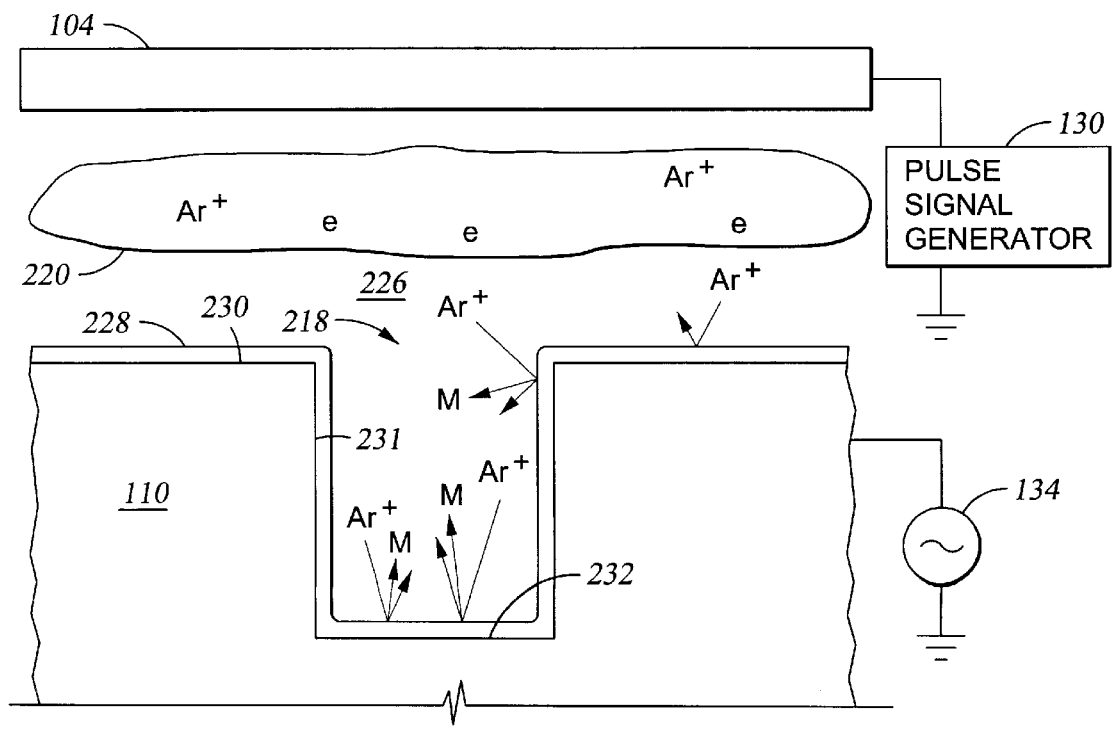
FIG. 7 shows the substrate and target of FIG. 6 and illustrates re-sputtering of a material from the substrate.

Once the applied bias to the target 104 is terminated during the zero-voltage portion 202 of the signal 200, sputtering from the target 104 ceases. Without a target bias, the substrate 110 experiences deposition resulting only from sputtering of the coil 122. However, as a result of applied negative bias provided by the third power supply 134, the substrate 110 continues to experience re-sputtering due to Ar ion bombardment. FIG. 7 shows a schematic representation of the re-sputtering of layer 228 caused by the Ar ions. In particular, the bias to the substrate 110 causes the Ar ions to strike the bottom 232 of the feature 218 (as well as the field of the substrate) causing re-sputtering of the deposited layer 228 onto the sidewalls 231. Accordingly, material can be redistributed from the bottom 232 onto the sidewalls 231 to ensure sidewall coverage. Further, overhangs, are etched during the re-sputtering step and result in opening of the features. Thus, the potential for the formation of voids is minimized. In addition, the layer 228 formed on the field 230 of the substrate 110 is re-sputtered and redistributed into the feature 218, thereby providing more deposition onto the sidewalls 231 and the bottom 232.

As a result, in tandem with other process parameters, such as the pressure, substrate bias power and coil power, the invention can modify step coverage and film thickness uniformity over prior art methods. The invention has particular application in barrier layer and seed layer deposition wherein film quality is particularly important to ensure good results in subsequent processes, such as electroplating. Table I provides exemplary materials and ranges for various process parameters. However, Table I is merely illustrative and the invention contemplates other process recipe as well.

TABLE I

| Materials: | Ti, Cu, Ta, W, Al |
|---|---|
| Bias Power to Support Member: | 0 W to 1000 W |
| Bias Voltage induced on Support Member: | 0 V to −300 V |
| Coil Power: | 100 W to 6000 W |
| Coil Frequency: | 400 KHz to 60 MHz |
| Target Power: | 0 V to −600 V |
| Pressure | 0.1 mTorr to 100 mTorr |

While the foregoing is directed to the preferred embodiment of the present invention, other and further embodiments of the invention may be devised without departing from the basic scope thereof, and the scope thereof is determined by the claims that follow.

What is claimed is:

1. An apparatus, comprising:
   (a) a processing chamber;
   (b) a substrate support member disposed in the processing chamber having a first power source coupled to the substrate support member and configured to provide a constant voltage;
   (c) a target disposed in the processing chamber;
   (d) a second power source coupled to the target adapted to vary a voltage applied to the target between relatively higher and lower voltage values while the constant voltage is provided to the substrate support member; and
   (e) an electromagnetic field source.

2. The apparatus of claim 1, wherein the first power source is a radio frequency (RF) power source.

3. The apparatus of claim 1, wherein the second power source is selected from the group of a pulsed direct current (DC) power source, a pulsed RF power source, a DC power source in combination with a switch and any combination thereof.

4. The apparatus of claim 1, wherein the second power source is a pulsed DC power source adapted to provide a signal having a negative voltage portion and a zero-voltage portion.

5. The apparatus of claim 1, wherein the target comprises a material selected from the group consisting of Ti, Cu, Ta, W, Al and any combination thereof.

6. The apparatus of claim 1, further comprising a gas source coupled to the processing chamber to supply a gas for creating a plasma during processing.

7. The apparatus of claim 1, wherein the electromagnetic field source is a coil having a power supply coupled thereto.

8. The apparatus of claim 7, wherein the coil is disposed within the processing chamber.

9. A method of depositing a material on a substrate in a process chamber, wherein the substrate includes a feature formed therein, comprising:
   (a) providing a plasma in the process chamber;
   (b) biasing the substrate with a constant negative voltage; and
   (c) during step (b), alternating between a sputtering and a reverse sputtering step, wherein the sputtering step comprises applying a bias to a target and the reverse sputtering step comprises terminating the bias to the target.

10. The method of claim 9, wherein the sputtering step is adapted to provide net deposition of material on the substrate and the reverse sputtering step is adapted to provide net removal of material from the substrate.

11. The method of claim 9, wherein (a) comprises;
(1) supplying a gas; and
(2) supplying a radio frequency (RF) signal to a coil.

12. The method of claim 9, wherein (b) comprises supplying a radio frequency (RF) signal to the substrate.

13. The method of claim 9, wherein the bias to the target comprises providing at least one of an RF signal and a DC signal to the target.

14. A method of depositing a material on a substrate in a process chamber having a target disposed therein, comprising:
(a) providing a plasma in the process chamber;
(b) biasing the substrate with a constant negative voltage;
(c) energizing a coil; and
(d) biasing the target with a signal having a negative voltage portion and a zero-voltage portion while biasing the substrate with the constant negative voltage.

15. The method of claim 14, wherein (c) comprises supplying a radio frequency (RF) signal to the coil.

16. The method of claim 14, wherein (c) comprises supplying a radio frequency (RF) signal to the coil at a power between about 100 W and 6 KW and at a frequency between about 400 KHz and 60 MHz.

17. The method of claim 14, wherein (d) comprises supplying a DC (direct current) to the target.

18. The method of claim 14, wherein the negative voltage portion is between about 50 V and 600 V.

19. The method of claim 14, wherein the signal to the target has a frequency of between about 0.01 Hz and 1 Hz and the negative voltage portion has a pulse width between about 0.5 seconds and 60 seconds.

20. The method of claim 14, wherein the signal to the target has a duty cycle between about 10%–80%.

21. The method of claim 14, further comprising providing a device feature formed in the substrate having an aspect ratio greater than 2:1.

* * * * *

UNITED STATES PATENT AND TRADEMARK OFFICE
CERTIFICATE OF CORRECTION

PATENT NO. : 6,350,353 B2
DATED : February 26, 2002
INVENTOR(S) : Praburam Gopalraja et al.

It is certified that error appears in the above-identified patent and that said Letters Patent is hereby corrected as shown below:

Title page,
Item [57], ABSTRACT,
Line 18, please change "member" to -- members --.

Column 2,
Line 55, please change "layer conformal" to -- conformal layer --.

Column 4,
Line 27, please change "ire." to -- i.e. --.
Line 50, please change "146 arc" to -- 146 are --.

Column 7,
Line 18, please change "1 04" to -- 104 --.

Signed and Sealed this

Thirty-first Day of December, 2002

JAMES E. ROGAN
*Director of the United States Patent and Trademark Office*